United States Patent [19]

Inoue et al.

[11] Patent Number: 5,438,232
[45] Date of Patent: Aug. 1, 1995

[54] PIEZOELECTRIC LAMINATION ACTUATOR

[75] Inventors: Jiro Inoue; Jun Tabota; Shiro Makino; Atsushi Morikawa; Takeshi Eimori, all of Nagaokakyo, Japan

[73] Assignee: Murata Manufacturing Co., Ltd., Nagakakyo, Japan

[21] Appl. No.: 202,875

[22] Filed: Feb. 28, 1994

Related U.S. Application Data

[63] Continuation-in-part of Ser. No. 37,696, Mar. 25, 1993, abandoned, which is a continuation of Ser. No. 823,363, Jan. 21, 1992, abandoned.

[30] Foreign Application Priority Data

| Jan. 25, 1991 | [JP] | Japan | 3-007250 U |
| Jan. 25, 1991 | [JP] | Japan | 3-007251 U |
| Jan. 25, 1991 | [JP] | Japan | 3-007252 U |
| Jan. 25, 1991 | [JP] | Japan | 3-007253 U |
| Jan. 25, 1991 | [JP] | Japan | 3-007254 U |

[51] Int. Cl.$^6$ ............................................. H01L 41/08
[52] U.S. Cl. ................................ 310/328; 310/363; 310/366
[58] Field of Search ............... 310/312, 328, 363, 364, 310/366, 340, 346

[56] References Cited

U.S. PATENT DOCUMENTS

| 3,521,090 | 7/1970 | Angeloff | 310/366 X |
| 3,989,965 | 11/1976 | Smith et al. | 310/334 |
| 4,523,121 | 6/1985 | Takahashi et al. | 310/334 |
| 4,633,120 | 12/1986 | Sato et al. | 310/328 |

(List continued on next page.)

FOREIGN PATENT DOCUMENTS

| 2431985 | 1/1975 | Germany. |
| 3330538 | 3/1985 | Germany. |

(List continued on next page.)

OTHER PUBLICATIONS

Patent Abstract of Japan, 2-265578, E1023, Jan. 16, 1991, vol. 15, No. 18, "Electrostrictive Effect Element".

Patent Abstract of Japan, 60-128682, E-358, Nov. 15, 1985, vol. 9, No. 288, "Manufacture of Laminating Type Piezoelectric Actuator".

Patent Abstract of Japan, 63-290258, C-578, Mar. 20, 1989, vol. 13, No. 115, "Formation Composite Thin Film".

*Primary Examiner*—Mark O. Budd
*Attorney, Agent, or Firm*—Wenderoth, Lind & Ponack

[57] ABSTRACT

A piezoelectric lamination actuator is disclosed which is used as a driving source, such as for a printer head. In the actuator, a number of piezoelectric layers, each sandwiched between internal electrodes, are laminated with one on top of another by glue. A dielectric layer is glued on each end of the laminated piezoelectric body formed of piezoelectric layers, and thin-film external electrodes are formed on two diagonally opposite sides of the laminated piezoelectric body. One thin-film external electrode is connected to every second internal electrode, and the other thin-film external electrode is connected to the remaining internal electrodes. External electrodes are formed by sputtering or by thin metal straps, to reinforce the external electrodes and associated soldering joints. Dielectric layers at both ends of the actuator can be made up of a plurality of dielectric sub-layers glued together by a moisture resistant adhesive agent, thereby preventing moisture from entering through the dielectric layers. A multiple-unit actuator can be formed of a plurality of actuator units attached with one another at their dielectric layers. Metal straps are employed to connect the neighboring external electrodes of the actuator units. Projected portions are eliminated, and the actuator is made compact. Dielectric layers at the ends of the actuator are thicker than the rest of the intermediate dielectric layers, thereby allowing a larger coating area on the end dielectric to effectively prevent moisture from entering. The thinner intermediate dielectric layers minimize reductions in the displacement output.

12 Claims, 6 Drawing Sheets

U.S. PATENT DOCUMENTS

| | | | |
|---|---|---|---|
| 4,641,052 | 2/1987 | Kobayashi | 310/328 X |
| 4,700,204 | 10/1987 | Nakayama | 346/140 |
| 4,780,639 | 10/1988 | Shirasu | 310/328 |
| 4,803,763 | 2/1989 | Eturo et al. | 310/328 X |
| 4,845,399 | 7/1989 | Yasuda et al. | 310/328 |
| 4,885,498 | 12/1989 | Wakita | 310/328 |
| 4,932,119 | 6/1990 | Ealey et al. | 310/328 X |
| 4,978,881 | 12/1990 | Wakita et al. | 310/325 |
| 4,994,703 | 2/1991 | Oguri et al. | 310/363 |
| 5,089,739 | 2/1992 | Takahashi et al. | 310/328 |

FOREIGN PATENT DOCUMENTS

| | | | |
|---|---|---|---|
| 3832658 | 4/1989 | Germany. | |
| 3833081 | 4/1990 | Germany. | |
| 0092068 | 4/1988 | Japan | 310/366 |
| 0237084 | 9/1990 | Japan | 310/328 |
| 1049573 | 1/1981 | U.S.S.R. | |
| 947934 | 7/1982 | U.S.S.R. | |

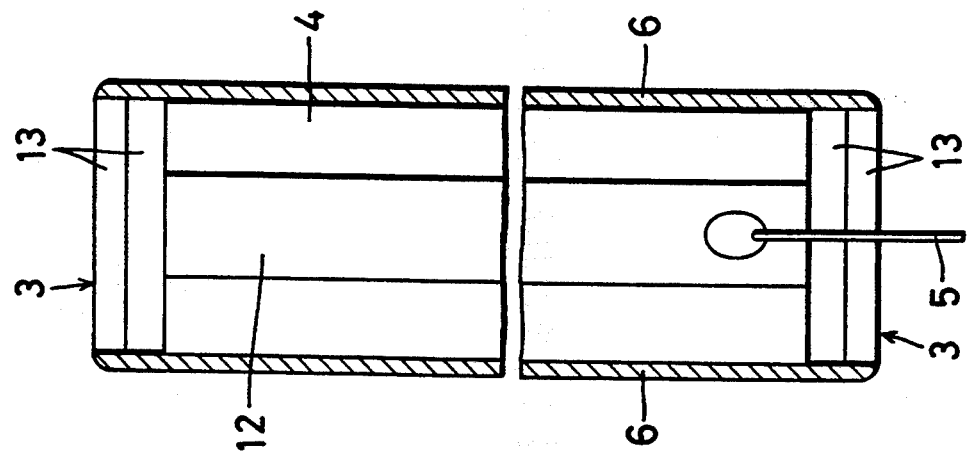
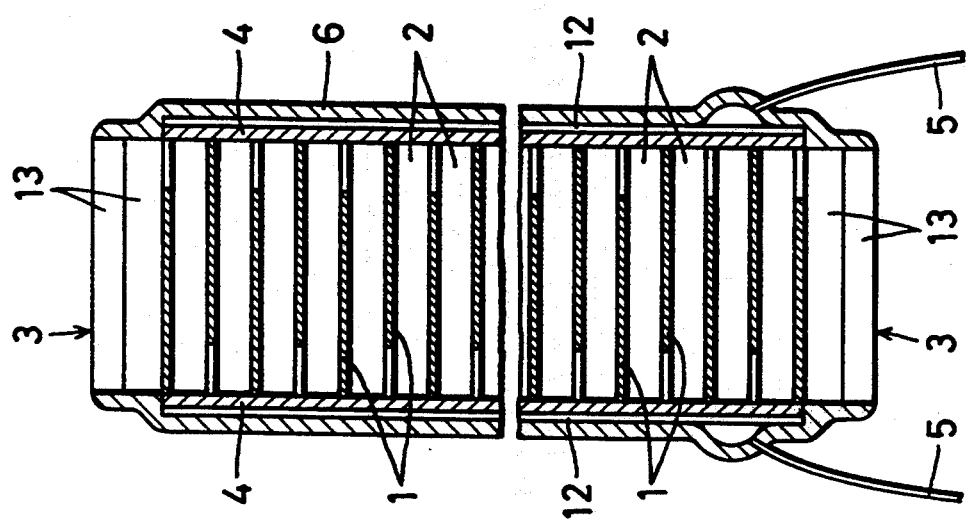
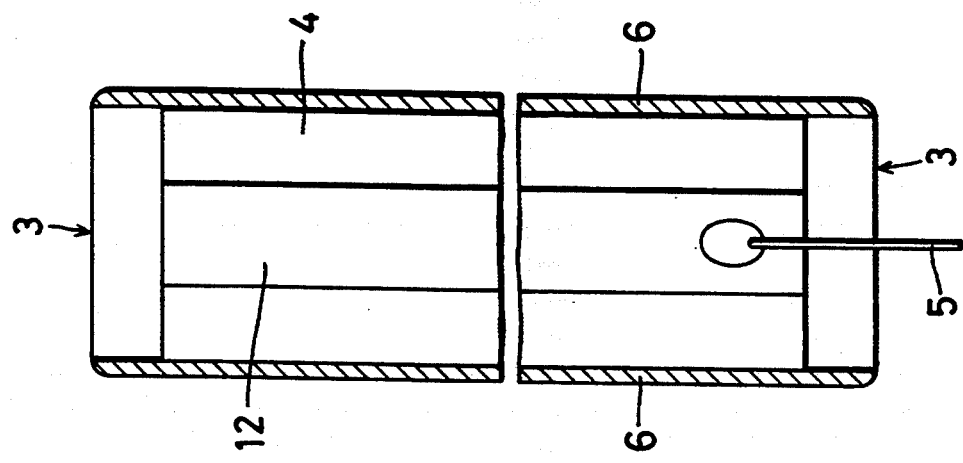

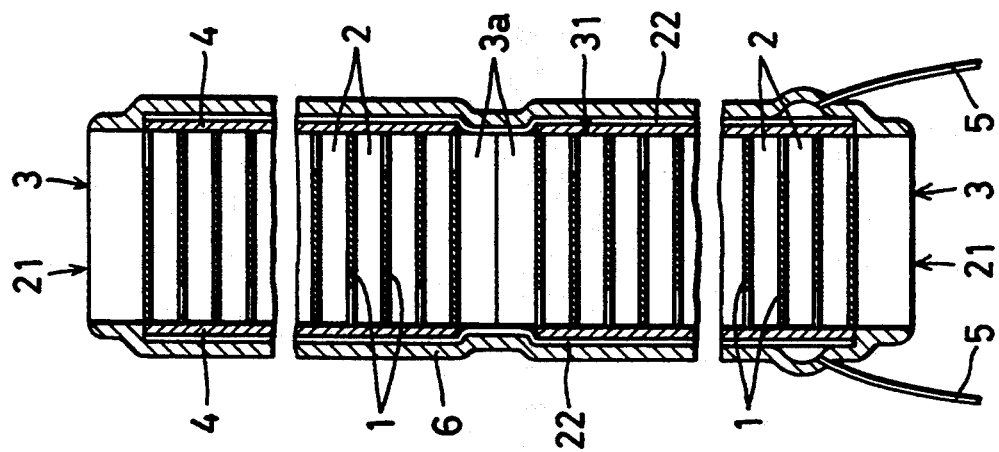
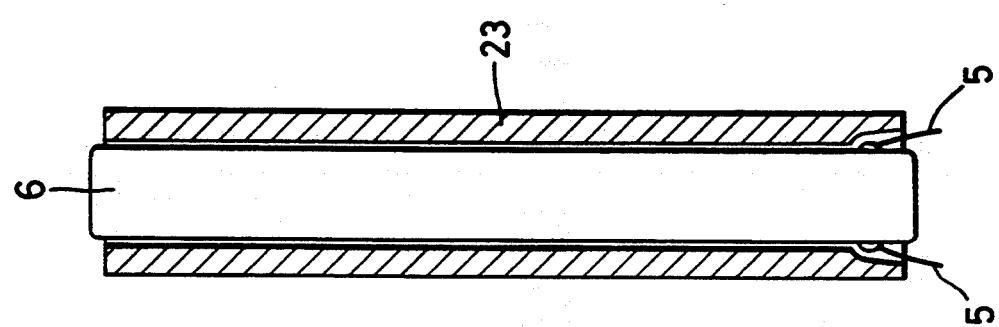
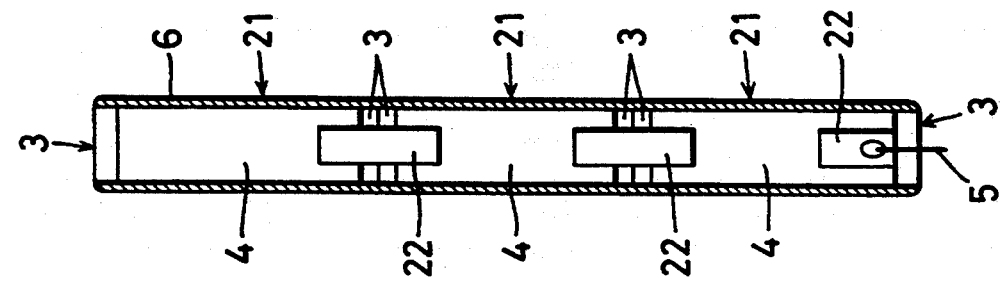

PIEZOELECTRIC LAMINATION ACTUATOR

This application is a continuation-in-part of now abandoned application, Ser. No. 08/037,696, filed Mar. 25, 1993 which is a continuation of now abandoned application, Ser. No. 07/823,363, filed Jan. 21, 1992.

BACKGROUND OF THE INVENTION

1. Field of the Invention

The present invention relates to a piezoelectric lamination actuator used as driving a source, such as for a printer head, a positioning stage in a piezoelectric longitudinal effect.

2. Description of the Related Art

Two types of piezoelectric lamination actuators have conventionally been available: a first type is a lamination actuator made up of a number of piezoelectric layers with both ends of the actuator terminated by dielectric layers; a second type is a multiple-unit actuator which comprises a plurality of the first type of actuators connected together.

As shown in FIG. 14 and FIG. 15, the first type of piezoelectric lamination actuator according to the prior art comprises a laminated piezoelectric body made up of a number of piezoelectric layers 2, each sandwiched between internal electrodes 1. Glued on both ends of the laminated body are dielectric layers 3, one for each end. Two external electrodes 4 are coated on two diagonally opposite sides of the laminated piezoelectric body of the piezoelectric layers 2, with one external electrode connected to every second internal electrode and the other external electrode connected to the rest of the internal electrodes. Lead wires 5 are soldered to the external electrodes 4. The sides of the laminated piezoelectric body of the piezoelectric layers 2 and the dielectric layers 3 are coated with dielectric resin, such as epoxy resin, silicone rubber, in order to keep moisture off, and assure insulated construction.

As shown in FIG. 16, the internal electrodes, which sandwich each piezoelectric layer 2, alternate spatially between a positive electrode 1a and a negative electrode 1b, so that the direction of the electric field reverses spatially in an alternate manner as well. Each internal electrode has, on its one open end, a non-electrode portion.

These piezoelectric layers 2 are stacked in lamination, by gluing them on top of each other with dielectric resin adhesive as shown in FIG. 16. Even though dielectric resin adhesive is employed, the use of press bonding permits conductivity between two internal electrodes. A conductive adhesive agent has conventionally been employed to form the two external electrodes 4, 4 on the two sides of the laminated piezoelectric body of the piezoelectric layers 2. The conductive adhesive agent coated on the laminated piezoelectric body of the piezoelectric layers 2 is subjected to a hot setting treatment, causing it to be connected to internal electrodes as shown in FIG. 16. The external electrodes 4, formed by hot setting the coated conductive adhesive agent, are subject to poor contact with the internal electrodes 1; defective actuators thus frequently result in the prior art actuator.

The external electrodes 4 are mechanically weak, and soldering Joints of the lead wires 5 are weak, as well.

Furthermore, since the dielectric layers 3 on both ends of the laminated piezoelectric body are normally glued or press bonded onto driven bodies, the dielectric layers 3 cannot be covered with a coating material 6. For the purpose of manufacturing efficiency, the same sort of ceramic material as the piezoelectric, layers 2 is commonly employed as the dielectric layers 3. In general, such sort of dielectric ceramic material has a poor moisture resistance characteristic.

The poor moisture resistant dielectric layers 3 allow moisture to intrude and reach internal electrodes 1 or piezoelectric layers 2, thereby deteriorating dielectric strength.

Although thickening the ceramic material employed as the dielectric layers 3 improves moisture resistance, reduced output displacement results while the actuator is in service. It should be noted that the dielectric layers 3 are non-driving members, which do not contribute to the displacement output.

The second type of actuator is now discussed. When an actuator having numerous laminations is constructed using numerous piezoelectric layers 2, for example, the thickness of the actuator without both dielectric layers fitted thereon is about 120 mm if 800 layers are laminated, assuming that each layer is 150 $\mu$m and that the actuator is made up of a single body rather than multiple-unit bodies combined.

With these layers glued in a single body construction, the entire actuator becomes unusable if any defects, such as dielectric deterioration, take place in any one single layer out of 800 layers.

The more the number of laminations of piezoelectric layers employed, the smaller the yield rate of actuator production results. A lowered production efficiency also results.

To overcome this disadvantage, the following method is available: several actuator units 7, each having the proper number of laminations of piezoelectric layers which still provide an acceptable yield rate, for example, four actuator units, each having 200 layers with an overall thickness of about 30 mm, may be longitudinally glued together to form a multiple-unit lamination actuator.

Such a construction involves electrically connecting external electrodes of two neighboring actuator units. As shown in FIG. 17, lead wires 8 are soldered on external electrodes 4 to connect the actuator units.

When each lead wire 8 is soldered to electrically connect the neighboring electrodes 4, a projected portion extends outward from the actuator body at each junction where a lead wire 8 is soldered. If the actuator is placed in a metallic housing 9 to protect the lead wires 8 against possible breakage due to buckling as in FIG. 18, the metallic housing should have sufficient internal capacity to accommodate the projected portions. A large metallic housing 9 is thus needed.

Soldering each lead wire 8 involves an increased number of soldering Joints, thereby lowering the production efficiency. Furthermore, each junction point between two neighboring actuator units 7 is mechanically weak.

Each ceramic dielectric layer 3 on both ends of each actuator unit 7 serves as a machining allowance portion to be adjusted so that both ends of the actuator unit 7 are accurately in parallel when the actuator unit 7 is machined, and serves as a protective member against moisture or mechanical damage when the actuator is put into service. The dielectric layers 3 are non-driving members which do not contribute to the displacement output.

Each actuator unit 7 according to the prior art employs dielectric layers 3 which are made of ceramic and machined to equal thickness. If two actuator units 7 are connected, the thickness of internal dielectric layers becomes double. As already mentioned, the dielectric layers 3 do not contribute to the displacement output. The thicker is the total thickness of the dielectric layers, the lower is the output displacement.

SUMMARY OF THE INVENTION

The present invention has been developed with a view to substantially solving the above described disadvantages.

Specifically, a first embodiment of the present invention provides a piezoelectric lamination actuator which assures secure contact between the external and internal electrodes, and strengthens the soldering joints of each lead wire.

A second embodiment of the present invention provides a piezoelectric lamination actuator which prevents itself from deteriorating in performance even when cracks develop on the external electrodes and strengthens soldering joints of each lead wire.

A third embodiment of the present invention provides a piezoelectric lamination actuator which offers improved moisture resistance for the dielectric layers without increasing their thicknesses, and prevents itself from deteriorating the internal dielectric characteristic without affecting the displacement output.

A fourth embodiment of the present invention provides a piezoelectric lamination actuator, wherein the piezoelectric lamination actuator is made up of a plurality of actuator units connected together, and wherein the actuator offers compactness in both the actuator body and its housing by eliminating unnecessary projected portions at each junction between actuator units, and also improves mechanical strength at the junctions, allowing the production efficiency to increase.

A fifth embodiment of the present invention provides a piezoelectric lamination actuator, wherein the piezoelectric lamination actuator is made up of a plurality of actuator units connected, and wherein both reduction in the output displacement and intrusion of moisture are kept to a minimum.

BRIEF DESCRIPTION OF THE DRAWINGS

These and other objects and features of the present invention will become apparent from the following description taken in conjunction with the preferred embodiment thereof with reference to the accompanying drawings, in which:

FIG. 4 is a vertical side cross-sectional view showing the piezoelectric lamination actuator according to the second embodiment of the present invention;

FIG. 5 is a vertical front cross-sectional view showing a piezoelectric lamination actuator according to a third embodiment of the present invention;

FIG. 6 is a vertical side cross-sectional view showing the piezoelectric lamination actuator according to the third embodiment of the present invention;

FIG. 10 is a transverse cross-sectional view showing the piezoelectric lamination actuator according to the fourth embodiment of the present invention, wherein metallic straps are used for connection in a different manner;

FIG. 11 is a cross-sectional view showing the actuator in FIG. 10 placed in a housing;

FIG. 12 is a vertical front cross-sectional view showing a piezoelectric lamination actuator according to a fifth embodiment of the present invention;

DETAILED DESCRIPTION OF THE PREFERRED EMBODIMENTS

Figure 3:
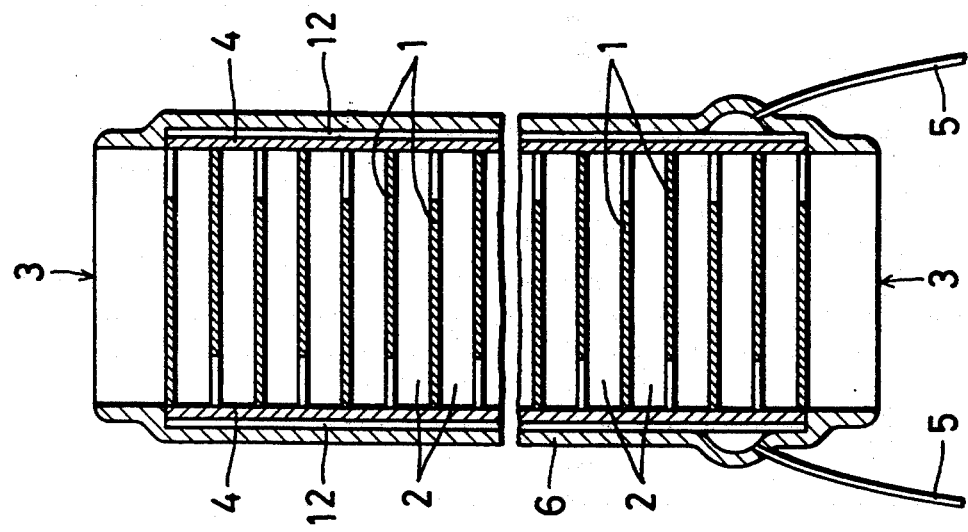
FIG. 3 is a vertical front cross-sectional view showing a piezoelectric lamination actuator according to the second embodiment of the present invention.

Referring now to FIG. 1 through FIG. 13, each embodiment of the present invention is described below. If these figures show any part identical to that illustrated in the prior art actuators in FIG. 14 through FIG. 18, the same reference numeral is quoted and no particular description is further provided.

Figure 2:
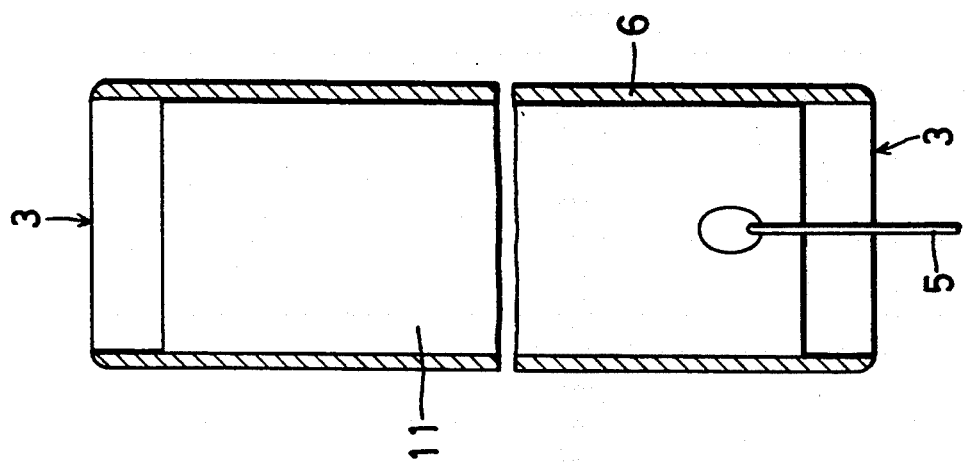
FIG. 2 is a vertical side cross-sectional view showing the piezoelectric lamination actuator according to the first embodiment of the present invention.
Figure 1:
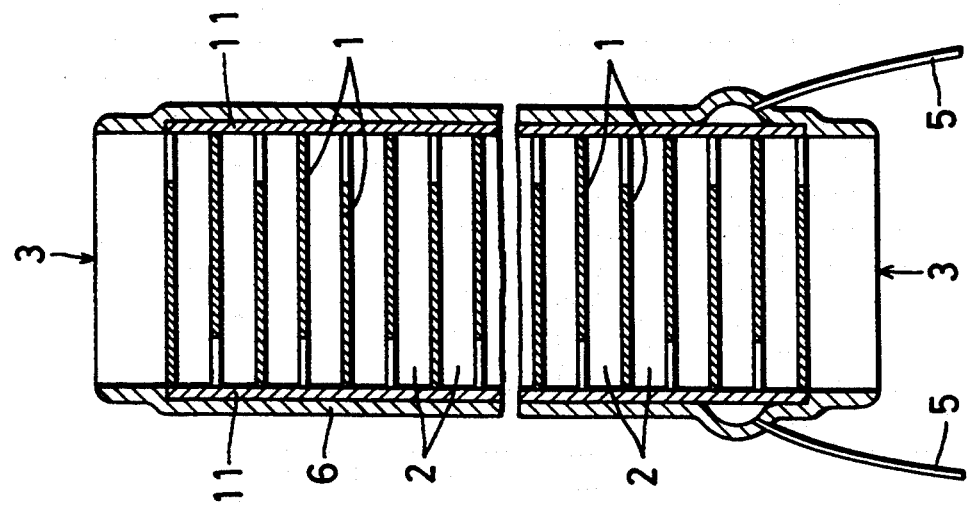
FIG. 1 is a vertical front cross-sectional view showing a piezoelectric lamination actuator according to a first embodiment of the present invention.
Figure 9:
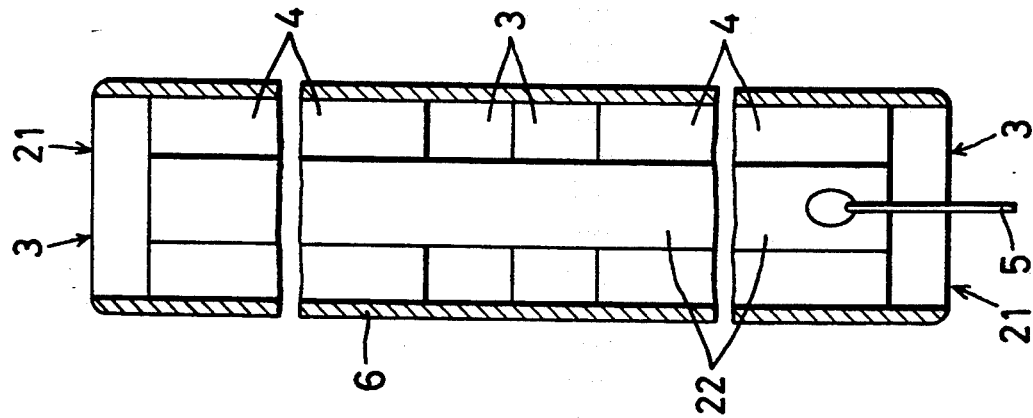
FIG. 9 is a transverse cross-sectional view showing the piezoelectric lamination actuator according to the fourth embodiment of the present invention.
Figure 8:
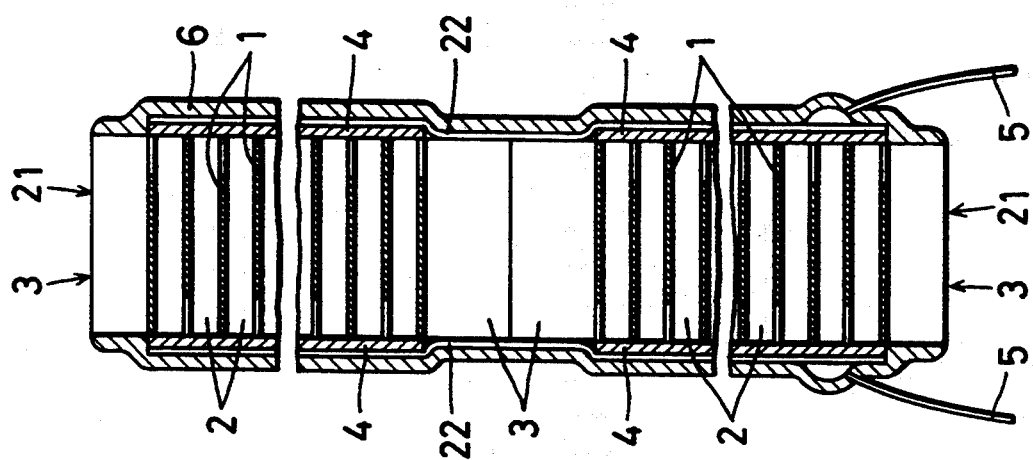
FIG. 8 is a vertical front cross-sectional view showing a piezoelectric lamination actuator according to a fourth embodiment of the present invention.

In a first embodiment of the present invention illustrated in both FIG. 1 and FIG. 2, thin-film external electrodes 11, made of conductive material, such as nickel (Ni) alloy, silver (Ag), are formed on both sides of a laminated piezoelectric body of piezoelectric layers 2 by means of sputtering. The thin-film external electrodes 11 formed by the sputtering method permit excellent bonding strength, assuring their firm connection with the internal electrodes.

In a preferred form of the present invention, the external electrodes, which are preferably formed by sputtering, are formed of a Ni—Cu alloy for which the Ni content is 50% or more. Since a lamination actuator is used under a high voltage, migration is generated due to the existence of moisture thereabout and thus, there is a possibility of poor insulation. In general, Cu is a metal for which migration tends to be generated. However, migration tends not to be generated for Ni. Thus, the use of Ni—Cu containing 50% or more of Ni tends to suppress the generation of migration. When the content of Ni is less than 50%, it is impossible to sufficiently suppress the generation of migration.

Furthermore, the thin-film external electrodes formed by the sputtering method provide excellent bonding strength to the piezoelectric layers 2 as well, thereby reinforcing the strength of the soldering joints of lead wires 5. Indicated at 6 in FIG. 1 and FIG. 2 is a coating material which covers the sides of the laminated piezoelectric body of the piezoelectric layers 2 and dielectric layers 3 to provide insulation and moisture-proofness.

Since the thin-film external electrodes are formed on the sides of the laminated piezoelectric body of the piezoelectric layers by means of the sputtering technique as mentioned above, the dielectric lamination actuator according to the first embodiment provides firm connections between the internal electrodes and the thin-film external electrodes of the laminated piezoelectric body. A high yield rate and a reliability of production are thus achieved.

The thin-film external electrodes formed by the sputtering technique allow the strength of soldering joints of lead wires to increase.

A piezoelectric lamination actuator according to a second embodiment of the present invention is illustrated in both FIG. 3 and FIG. 4,. Thin metal straps 12 are glued onto thin-film external electrodes 4 on both sides of the laminated piezoelectric body of the piezoelectric layers 2. Lead wires 5 are soldered to the thin metal straps 12. The sides of the laminated piezoelectric body of the piezoelectric layers 2 and dielectric layers 3 are covered with the coating material 6 for the purpose of insulation and moisture-proofness.

The above-mentioned metal straps 12 do not need to cover the entire areas of the thin-film external electrodes 4; their area may be determined according to manufacturing considerations (see FIG. 4). For example, 30 μm thick, and 2 mm wide metal straps, made of SUS304, 42Ni, are glued onto the thin-film external electrodes 4 with a conductive adhesive agent or a non-conductive adhesive agent like epoxy resin. Although the metal straps may preferably extend to cover the entire length of the thin-film external electrodes 4, partial covering with the metal straps still works.

Although in the above example, the metal straps 12 are 30 μm thick, proper thickness for the metal straps 12 is 100 μm or less. Since when the lamination actuator is driven, there is a possibility that discontinuities due to cracks or the like created in the sputtered external electrodes 4, the metal straps 12 are required in order to reinforce the electrical connection. The metal straps also provide mechanical reinforcement.

Each of the metal straps is glued on a side of the lamination actuator with an epoxy adhesive. Thus, if the thickness of the strap is greater than 100 μm, the strength thereof is too great and the flexibility is too low and, as a result, the displacement output of the actuator is reduced. Thus, with the above construction of the present invention, wherein the thickness of the metal strap is restricted to 100 μm or less, the displacement output of the actuator is not damaged and the electrical connection therefor can be assured.

Further, if a lead wire or the like is fitted directly by soldering onto the external electrodes formed by sputtering, a migration is generated in the external electrodes such that the reliability of the electrical connection is reduced. In the present invention, this problem can be solved by using the metal strap, and since the metal strap and the lead wire are soldered together, the tensile strength of the lead wire is improved.

The piezoelectric lamination actuator according to the second embodiment of the present invention is mentioned above. Since thin metal straps 12 are attached onto the external surfaces of the thin-film external electrodes 4, the thin-film external electrodes 4 are mechanically reinforced. Even when cracks develop in the thin-film external electrodes 4 because of distortion arising from the effect of expansion and contraction, supply voltage is fed via the metal straps 12 regardless of disconnection at the cracks in the thin-film external electrodes 4. Thus, performance deterioration is prevented.

The lead wires 5 are directly soldered onto the metal straps 12, and thus sufficient soldering strength is ensured.

According to the second embodiment of the present invention as mentioned above, by means of the thin metal straps which are attached on the thin-film external electrodes disposed on the sides of the laminated piezoelectric body of the piezoelectric layers, the piezoelectric lamination actuator prevents itself from deteriorating in performance even when cracks develop on the thin-film external electrodes. The metal straps work as conductors to feed supply voltage forward to piezoelectric layers which remain disconnected from the rest of the laminated piezoelectric layers by the cracks.

Figure 7:
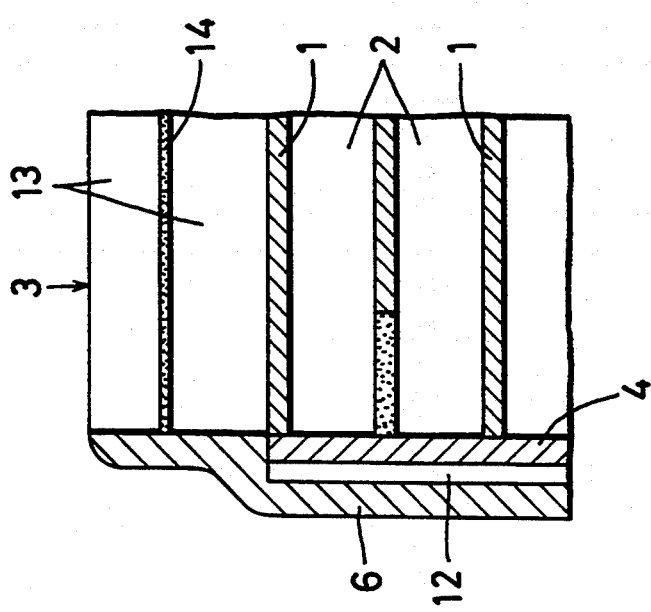
FIG. 7 is an enlarged vertical cross-sectional view of FIG. 6.
Figure 15:
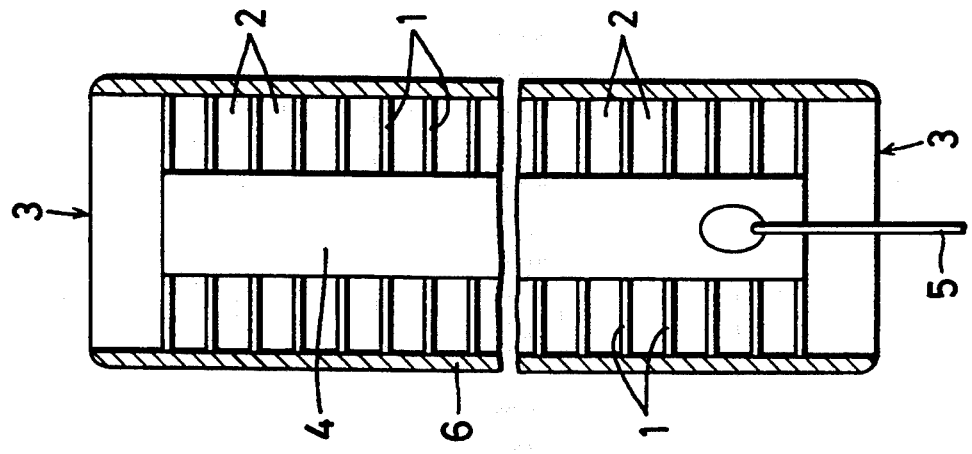
FIG. 15 is a vertical side cross-sectional view showing the prior art piezoelectric actuator in FIG. 14.
Figure 14:
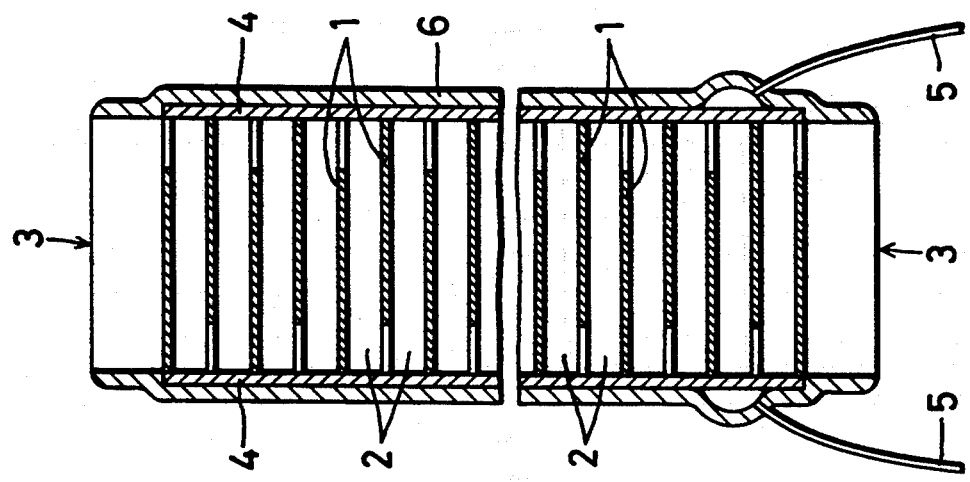
FIG. 14 is a vertical front cross-sectional view showing a prior art piezoelectric actuator.

A piezoelectric lamination actuator according to a third embodiment of the present invention is illustrated in FIG. 5 through FIG. 7. The dielectric layers 3 disposed on both ends of the laminated piezoelectric body of the piezoelectric layers 2 are formed by a plurality of dielectric sub-layers 13, which are glued by a moisture resistant adhesive agent. A required number of the dielectric sub-layers 13, each made of thin ceramic layer, are glued by a moisture resistant adhesive agent such as bisphenol A epoxy resin to form laminated dielectric layers 3.

As shown in FIG. 7, a moisture resistant layer 14 is formed between dielectric sub-layers 13 by the moisture resistant adhesive agent which first serves as a glue as well between both dielectric sub-layers 13.

The piezoelectric lamination actuator according to the third embodiment of the present invention is constructed as mentioned above. To keep moisture out, the coating material 6 covers the sides of the dielectric layers 3 on both ends of the laminated piezoelectric body of the piezoelectric layers 2 and the sides of the laminated piezoelectric body of the piezoelectric layers 2. The moisture resistant layers 14, disposed between dielectric sub-layers 13, keep out moisture which could intrude from both ends. Ingress of moisture is thus entirely prevented, and dielectric deterioration inside is prevented.

The moisture resistant layers 14, disposed between dielectric sub-layers 13, eliminate the need to thicken the dielectric layers 3 for the purpose of increasing the moisture resistance; thus, degradation in the displacement output is avoided by making thinner the dielectric layers 3 which do not contribute to the displacement output.

According to the third embodiment of the present invention, the dielectric layers are disposed on both ends of the laminated piezoelectric body of piezoelectric layers, wherein the dielectric layers are formed by gluing a plurality of dielectric sub-layers between which moisture resistant layers are formed. Such a construction improves the moisture resistance of the dielectric layers, preventing moisture from entering via both ends, and consequently avoiding dielectric deterioration.

Furthermore, since the moisture resistance of the actuator is increased without thickening the dielectric layers, no reduction of the displacement output results.

A piezoelectric lamination actuator according to the fourth embodiment of the present invention is illustrated in FIG. 8 through FIG. 11. Two actuator units 21 are connected to form an actuator with a large number of laminated layers. Metal straps 22 connect thin-film external electrodes 4 of both actuator units 21. Lead wires 5 are soldered to the end portions of the metal straps 22. Each of the actuator units 21 of the fourth embodiment can be constructed in similar manner to the lamination actuators according to the first through third embodiments. For example, the external electrodes 4 are preferably formed of a Cu—Ni alloy containing 50% or more of Ni. Also, the metal straps are preferably 100 μm or less in thickness.

The metal straps 22 are glued onto the thin-film external electrodes 4 by a conductive adhesive agent in a manner that the metal straps 22 cover the entire lengths of the external electrodes 4.

If three or more actuator units are employed, metal straps may be glued onto the thin-film external electrodes in the same manner as above. As shown in FIG. 10, however, one metal strap 22 may be glued onto each junction of the thin-film external electrodes 4 rather than glued in a manner that the metal straps 22 entirely cover the entire lengths of the external electrodes 4.

Employing the metal straps 22 to connect the thin-film external electrodes 4 allows the outward projected portions to be less projected. As shown in FIG. 11, a housing 23 having the actuator inside simply needs no additional inner space other than that necessary to accommodate the lead wires 5 thereby, allowing the housing to be more compact.

According to the fourth embodiment of the present invention, by means of the use of thin metal straps to connect the thin-film external electrodes of each actuator unit, the piezoelectric lamination actuator can be fitted into the compact-sized housing, by eliminating unnecessary projected portions at the actuator unit Junctions, and thus by eliminating inner space other than that for the lead wire entry portions.

The metal straps are glued onto the thin-film external electrodes by the conductive adhesive agent, keeping the number of soldering points required to a minimum and subsequently improving efficiency in the production stage. The junction portions between the actuator units are reinforced by each metal strap, making the junction portions mechanically strong, and electrically reliable.

Figure 13:
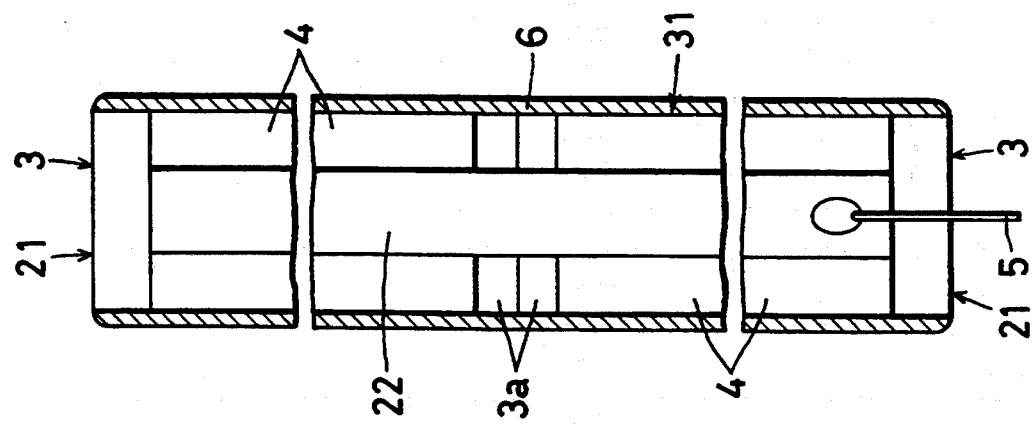
FIG. 13 is a transverse cross-sectional view showing the piezoelectric lamination actuator in FIG. 12.
Figure 18:
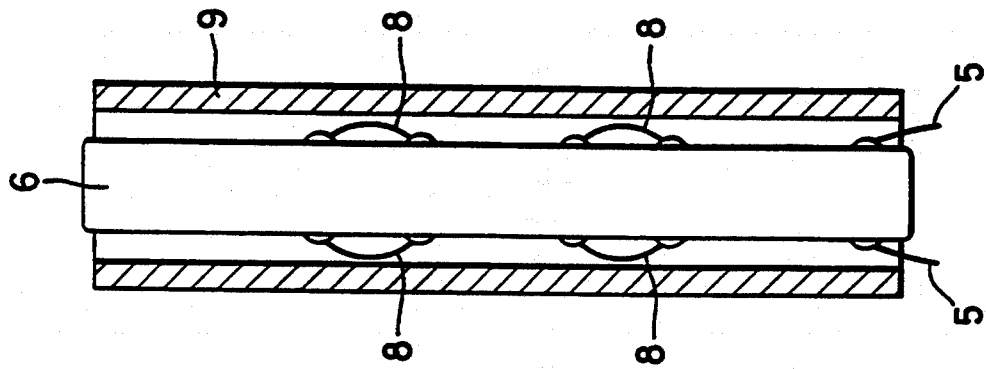
FIG. 18 is a cross-sectional view showing the prior art piezoelectric multiple lamination actuator of FIG. 17 placed into housing.
Figure 17:
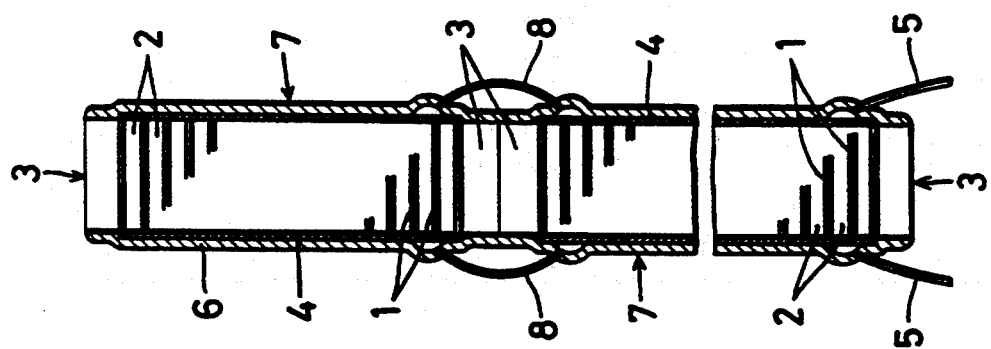
FIG. 17 is a vertical front cross-sectional view showing a prior art piezoelectric multiple lamination actuator.
Figure 16:
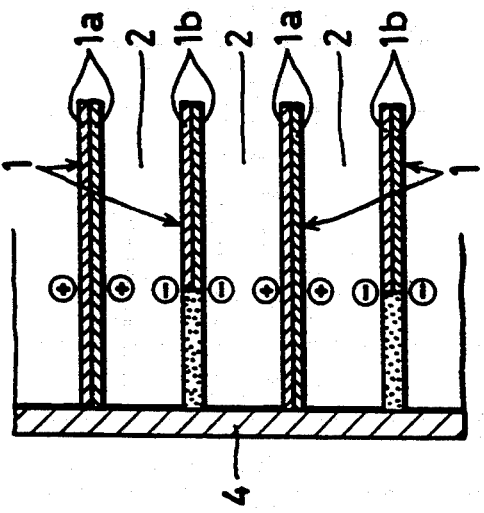
FIG. 16 is an enlarged cross-sectional view showing the structure of piezoelectric layers and electrodes in the prior art piezoelectric actuator in FIG. 15.

A piezoelectric lamination actuator according to a fifth embodiment of the present invention is illustrated in FIG. 12 and FIG. 13. In the multiple-unit type actuator 31 made up of two actuator units 21, the dielectric layers 3 disposed on both ends of the actuator 31 have a thicker construction, while the remaining dielectric layers 3 a disposed intermediately between the two actuator units 21 have a thinner construction. Thus, the first two dielectric layers 3 are different from the remaining two dielectric layers 3 a in thickness.

The thick dielectric layers 3 on both ends of the multiple-unit type lamination actuator 31 allows the multiple lamination actuator 31 to be covered on its sides with liberal amount of coating material 6, effectively preventing moisture from entering between the dielectric layers 3 and the coating material 6.

Since the dielectric layers 3 a interposed between the actuator units 21 are thinner than the dielectric layers 3 on both ends of the actuator 31, the overall thickness of the actuator units 21 is reduced to about half the prior art design. Such a thin design of the dielectric layers keeps reduction in the displacement output to a minimum in the multiple-unit type lamination actuator 31.

Although two actuator units 21 are connected in the multiple-unit type lamination actuator 31 illustrated in FIG. 12 and FIG. 13, three or more actuator units may be employed, in which case thinner dielectric layers may be used as intermediate dielectric layers between the actuator units.

In the above embodiment, the dielectric layer 3, 3a are of a single layers type. However, the dielectric layer 3, 3a may be made up of a lamination of two or more sub-layers. In such a case, the thickness of the dielectric layer is the sum of all the dielectric sub-layer thicknesses.

According to the fifth embodiment of the present invention, the dielectric layers disposed on both ends of the multiple-unit type piezoelectric lamination actuator are designed to be thicker, while the remaining dielectric layers disposed between the two actuator units are designed to be thinner. The piezoelectric lamination actuator thus keeps the reduction in the displacement output to a minimum while preventing moisture from entering via both ends of the actuator.

Although the present invention has been fully described by way of example with reference to the accompanying drawings, it is to be noted here that various changes and modifications will be apparent to those skilled in the art. Therefore, unless such changes and modifications otherwise depart from the scope of the present invention as defined by the appended claims, they should be construed as included therein.

What is claimed is:

1. A lamination type piezoelectric actuator comprising a plurality of elongated actuator units attached successively together along the direction of their lengths, wherein
    each of said actuator units comprises:
        a plurality of internal electrodes;
        a plurality of ceramic piezoelectric layers, each of which is sandwiched between a pair of said internal electrodes, said piezoelectric layers being laminated together by glue to form a piezoelectric body;
        dielectric layers mounted on opposing ends of said piezoelectric body by glue;
        first and second sputtered thin-film external electrodes formed on opposing first and second sides of said piezoelectric body, respectively, said first and second thin-film external electrodes being formed of a Cu—Ni alloy containing 50% or more Ni;
    wherein every other one of said internal electrodes extends from said first sputtered thin-film external electrode and only partially toward said second sputtered thin-film external electrode, and the remaining ones of said internal electrodes extend from said second sputtered thin-film external electrode and only partially toward said first sputtered thin-film external electrode; and
    wherein metal straps are attached by glue on exterior sides of said first and second sputtered thin-film external electrodes and connect said plurality of actuator units in succession, such that said metal straps constitute means for structurally connecting said actuator units in succession and electrically connecting said first sputtered thin-film external electrodes in succession and said second sputtered thin-film external electrodes in succession.

2. A lamination type piezoelectric actuator as recited in claim 1, wherein
each of said metal straps has a thickness of 100 μm or less.

3. A lamination type piezoelectric actuator as recited in claim 2, wherein
each of said metal straps has a thickness of 30 μm.

4. A lamination type piezoelectric actuator as recited in claim 1, further comprising
lead wires soldered onto said metal straps attached to said first and second sputtered thin-film external electrodes, respectively, of one of said actuator units.

5. A lamination type piezoelectric actuator as recited in claim 1, further comprising
an insulation coating material formed on exterior sides of each of said first and second sputtered thin-film external electrodes and on sides of said piezoelectric bodies.

6. A lamination type piezoelectric actuator as recited in claim 1, wherein
said thin metal straps extend substantially along the combined length of all of said actuator units.

7. A lamination type piezoelectric actuator as recited in claim 1, further comprising
an insulation coating material formed on exterior sides of said thin metal straps attached to said first and second sputtered thin-film external electrodes by glue, respectively.

8. A lamination type piezoelectric actuator as recited in claim 1, wherein
each of said ceramic piezoelectric layers is thinner than each of said dielectric layers;
two of said dielectric layers are disposed at opposing ends of said lamination type piezoelectric actuator and define end dielectric layers;
a remainder of said dielectric layers define internal dielectric layers; and
said internal dielectric layers are thinner than said end dielectric layers.

9. A lamination type piezoelectric actuator as recited in claim 1, wherein
each of said dielectric layers is formed of a plurality of dielectric sublayers connected together by a moisture resistant glue.

10. A lamination type piezoelectric actuator as recited in claim 1, wherein
said metal straps extend continuously along exterior sides, respectively, of said plurality of actuator units and are mounted substantially flush against said external electrodes and said dielectric layers.

11. A lamination type piezoelectric actuator comprising a plurality of elongated actuator units attached successively together along the direction of their lengths, wherein
each of said actuator units comprises:
a plurality of internal electrodes;
a plurality of ceramic piezoelectric layers, each of which is sandwiched between a pair of said internal electrodes, said piezoelectric layers being laminated together by glue to form a piezoelectric body;
dielectric layers mounted on opposing ends of said piezoelectric body by glue;
first and second sputtered thin-film external electrodes formed on opposing first and second sides of said piezoelectric body, respectively;
wherein every other one of said internal electrodes extends from said first sputtered thin-film external electrode and only partially toward said second sputtered thin-film external electrode, and the remaining ones of said internal electrodes extend from said second sputtered thin-film external electrode and only partially toward said first sputtered thin-film external electrode;
wherein metal straps are attached by glue on exterior sides of said first and second sputtered thin-film external electrodes and connect said plurality of actuator units in succession, such that said metal straps constitute means for structurally connecting said actuator units in succession and electrically connecting said first sputtered thin-film external electrodes in succession and said second sputtered thin-film external electrodes in succession; and
wherein each of said metal straps has a thickness of 100 μm or less.

12. A lamination type piezoelectric actuator as recited in claim 11, wherein
each of said metal straps has a thickness of 30 μm.

* * * * *